United States Patent
Hong et al.

(10) Patent No.: US 7,483,237 B2
(45) Date of Patent: Jan. 27, 2009

(54) COMPOSITE BASE PLATE FOR A DATA STORAGE DEVICE HAVING AN INTEGRAL PRINTED CIRCUIT BOARD

(75) Inventors: Yiren Hong, Singapore (SG); PohLye Lim, Singapore (SG); Mo Xu, Singapore (SG); TakKoon Ooi, Singapore (SG)

(73) Assignee: Seagate Technology LLC, Scotts Valley, CA (US)

(*) Notice: Subject to any disclaimer, the term of this patent is extended or adjusted under 35 U.S.C. 154(b) by 413 days.

(21) Appl. No.: 10/826,022

(22) Filed: Apr. 16, 2004

(65) Prior Publication Data

US 2005/0231848 A1 Oct. 20, 2005

(51) Int. Cl.
*G11B 25/04* (2006.01)
*G11B 33/12* (2006.01)

(52) U.S. Cl. .................................. 360/97.01
(58) Field of Classification Search ........... 360/97.01, 360/97.02, 97.03, 98.01, 900
See application file for complete search history.

(56) References Cited

U.S. PATENT DOCUMENTS

| | | | |
|---|---|---|---|
| 4,779,165 A * | 10/1988 | Elsaesser et al. | 360/97.02 |
| 4,818,907 A * | 4/1989 | Shirotori | 360/97.02 |
| 5,034,837 A * | 7/1991 | Schmitz | 360/97.01 |
| 5,214,549 A | 5/1993 | Baker et al. | |
| 5,235,482 A * | 8/1993 | Schmitz | 360/97.02 |
| 5,282,099 A | 1/1994 | Kawagoe et al. | |
| 5,282,100 A | 1/1994 | Tacklind et al. | |
| 5,414,574 A | 5/1995 | Boutaghou et al. | |
| 5,508,860 A * | 4/1996 | Takagi et al. | 360/97.01 |
| 5,650,895 A * | 7/1997 | Koizumi et al. | 360/97.03 |
| 5,654,847 A * | 8/1997 | Yagi et al. | 360/97.02 |
| 5,703,734 A | 12/1997 | Berberich et al. | |
| 5,757,580 A * | 5/1998 | Andress et al. | 360/97.02 |
| 5,768,049 A | 6/1998 | Morehouse et al. | |
| 6,034,841 A | 3/2000 | Albrecht et al. | |
| 6,320,723 B1 | 11/2001 | Bernett | |
| 6,597,531 B2 | 7/2003 | Noda | |
| 6,697,217 B1 * | 2/2004 | Codilian | 360/97.01 |
| 6,954,329 B1 * | 10/2005 | Ojeda et al. | 360/97.02 |
| 6,958,884 B1 * | 10/2005 | Ojeda et al. | 360/97.02 |
| 2002/0181155 A1 * | 12/2002 | Takagi et al. | 360/244.3 |
| 2003/0081347 A1 | 5/2003 | Neal et al. | |
| 2004/0222712 A1 * | 11/2004 | Hong et al. | 360/99.08 |

* cited by examiner

*Primary Examiner*—Craig A Renner
(74) *Attorney, Agent, or Firm*—Westman, Champlin & Kelly, P.A.

(57) ABSTRACT

A base plate for a disc drive incorporates a printed circuit board and connector assembly into an integral composite base that is bonded together to form a single composite structure. This structure provides the strength, stiffness and rigidity necessary to permit a reduction in overall thickness of a miniature disc drive to that substantially required for a Type I compact flash form factor data storage device.

20 Claims, 4 Drawing Sheets

US 7,483,237 B2

COMPOSITE BASE PLATE FOR A DATA STORAGE DEVICE HAVING AN INTEGRAL PRINTED CIRCUIT BOARD

FIELD OF THE INVENTION

This application relates generally to data storage devices and more particularly to a data storage device having a composite base plate incorporating a printed circuit board.

BACKGROUND OF THE INVENTION

Current disc drives store information on rotating discs that are typically either optical or magnetic. Magnetic discs are coated with a magnetizable medium on which data is recorded. The recorded information is arranged typically on concentric tracks around the axis of rotation of the discs. One or more transducers, commonly referred to as "heads", are movably positioned over the disc surfaces to read and write data from and to the rotating discs. The heads are mounted on an actuator that positions the heads over and moves them from one track to another on the disc. The sheer volume of magnetic disc drive production is increasing every year. In addition, the data density on each of the disc surfaces is being increased every year that require drive designs to be easily manufacturable. The size, or "form factor", of each generation of disc drives is continually getting smaller. The smallest drive currently in the market is a one-inch drive, which is in the form factor of a CF card (Compact Flash, type II). The type II CF form factor requires an overall thickness of no more than 5.5 mm. However, there is a continuing need to reduce the size of the drive even smaller without sacrificing capacity and performance.

An exploded view of the primary components of a base plate and printed circuit board assembly 100 for a conventional one-inch disc drive is shown in FIG. 1. A cross sectional view of the assembly 100 is shown in FIG. 2. The assembly 100 includes a base plate 102 to which various components of the disc drive will be subsequently mounted. Fastened to the bottom of the base plate 102 is a printed circuit board assembly 104. Finally, fastened to the bottom of the printed circuit board (PCB) assembly 104 is a printed circuit board (PCB) shield 106. These three components, the base plate 102, the PCB assembly 104, and the PCB shield 106, are mechanically assembled together in a conventional manner as is shown in the cross sectional view of FIG. 2. Here it can be seen that the PCB assembly 104 is spaced from both the PCB shield 106 and the base plate 102 by gaps 108 and 110. The drive motor coils 114 are installed in the base plate 102 before the PCB assembly 104 is installed on the base plate 102, thus requiring a drive motor connector having pins 116 to be present to contact with pads on the PCB assembly 104 when the PCB assembly 104 is joined with the base plate 102. This current base plate 102, at its thinnest, is about 0.5 mm thick. Reducing this thickness further leads to very severe structural instabilities.

One current challenge is to design a disc drive in a CF type I size. Such a drive has an overall thickness requirement of only 3.3 mm. There are no disc drives available that have a 3.3 mm thickness. A drive having a design thickness of only 3.3 mm has a number of problems. The base plate upon which the actuator and disc spin motor both are mounted becomes so thin as to be unacceptably structurally weakened. Thus a new concept of a base plate is needed that is both thin enough and strong enough to adequately support the moving components within the disc drive yet and, at the same time, permit a maximum thickness of the drive to be limited to 3.3 mm total form factor. The present invention provides a solution to this and other problems, and offers other advantages over the prior art.

SUMMARY OF THE INVENTION

Against this backdrop the present invention has been developed. An embodiment of a support structure for a data storage device such as a miniature disc drive in accordance with the present invention includes a base plate for supporting a drive motor and an actuator assembly, to which is fastened a printed circuit board via a layer of adhesive filling a gap between the board and the base plate. This layer is preferably an epoxy adhesive that together with the board and base plate forms a composite integral support structure. The disc drive may also have a shield plate spaced from the printed circuit board by a gap. However, in the present invention, this gap is in turn also filled with an epoxy adhesive layer to form a cohesive drive motor and actuator support structure that provides further stiffness to the composite structure. The printed circuit board components may project into apertures in the base plate so as to minimize the overall thickness of the composite structure.

These and various other features as well as advantages which characterize the present invention will be apparent from a reading of the following detailed description and a review of the associated drawings.

DETAILED DESCRIPTION

Figure 1:
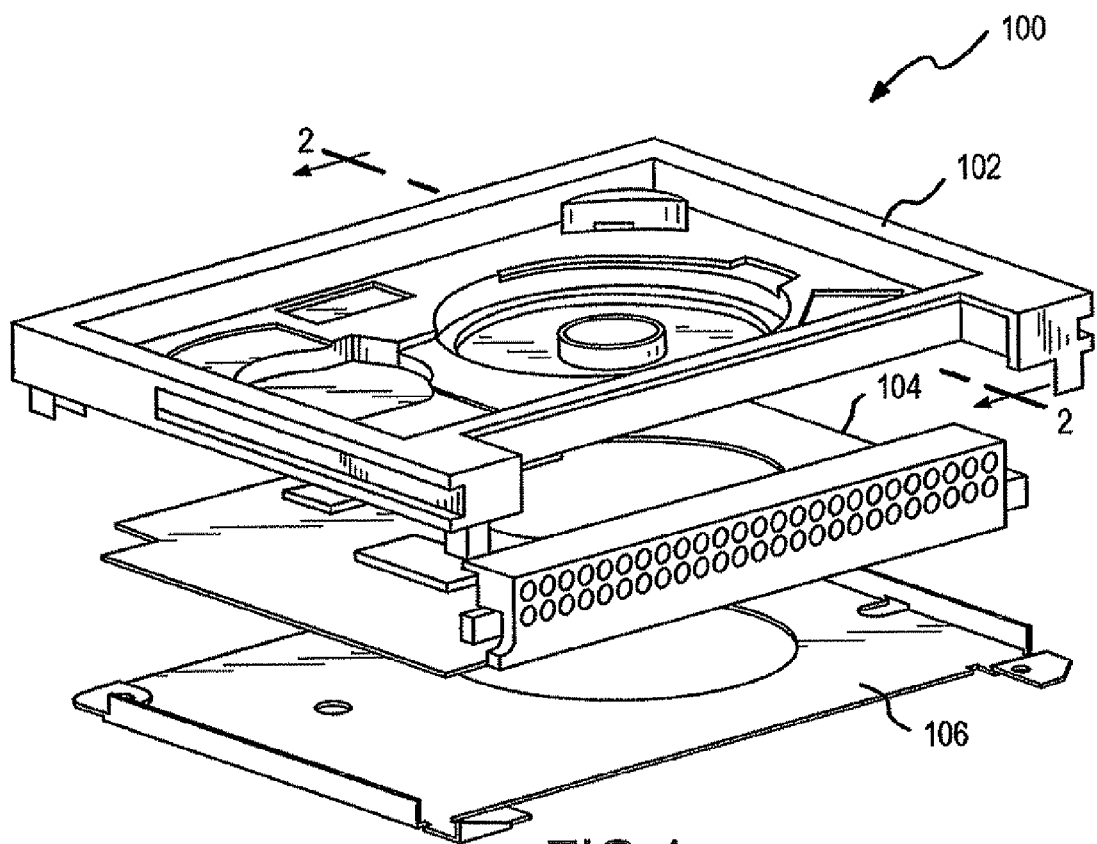
FIG. 1 is an exploded perspective view of the base plate and printed circuit board structure for a conventional one-inch disc drive.
Figure 2:
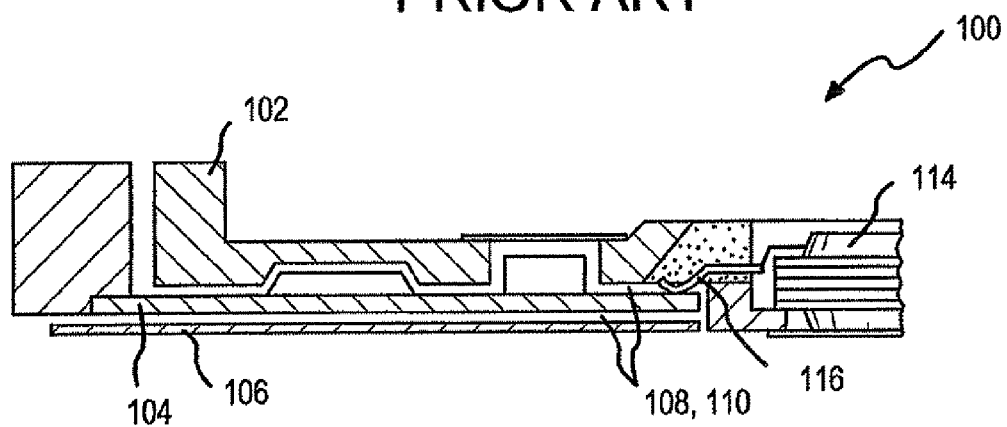
FIG. 2 is a partial cross sectional view of an assembled base plate and printed circuit board assembly for a conventional one-inch disc drive.
Figure 3:
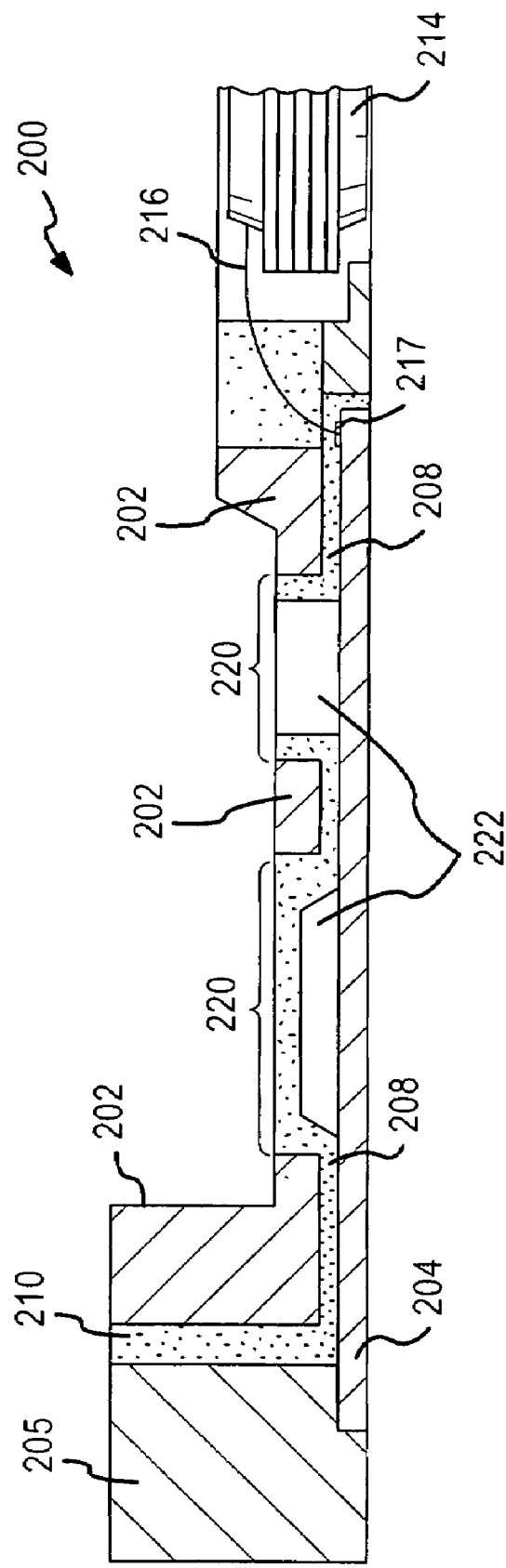
FIG. 3 is a partial cross sectional view of an embodiment of an integrated composite base plate and printed circuit board structure for a disc drive in accordance with an embodiment of the present invention.

Referring now to FIG. 3, a first embodiment of an integrated base plate and printed circuit board structure 200 in accordance with the present invention is shown in partial cross section. The composite structure 200 includes a base plate 202 similar in configuration to the base plate 102 shown in FIGS. 1 and 2, except that, at its thinnest, it is preferably between about 0.2 mm and 0.3 mm in thickness. Fastened to the base plate 202 is a printed circuit board assembly 204 that includes a connector 205. A gap 208 between these two components is filled with epoxy adhesive 210, which, when cured, bonds the base plate 202, the PCB together with the connector 205 in the PCB assembly 204, together to form an integrated, stiff disc drive base structure 200. The base plate 202 has one or more apertures 220 therethrough that are positioned to receive portions of integrated circuit components 222 on the printed circuit board assembly 204 when the printed circuit board assembly 204 is joined with the base plate 202. These apertures 220 are possible because of the greater strength and rigidity of the composite structure 200 in the present invention compared to a conventional base plate structure with the same thickness. This results in a structure 200 that is substantially rigid, providing the necessary support structure for the disc spin motor 214 and actuator assembly (not shown), while facilitating an overall drive thickness of no more than 3.3 mm, thus meeting the size requirements for a Compact Flash card Type I form factor. The epoxy adhesive layer 210, when cured, forms a substantially rigid layer between the base plate 202 and the printed circuit board assembly 204. The epoxy is preferably a thermally conductive epoxy to ensure that sufficient heat dissipation for the component 222, such as an integrated circuit, on the PCB 204 is maintained.

In the embodiment shown in FIG. 3, the PCB assembly 204 is installed on the base plate 202 before the drive motor stator coils 214 are installed. Therefore a connector and associated connector pins are not required. The drive motor coil leads 216 can be directly soldered to a solder pad 217 on the PCB assembly 204. In addition, because of the rigidity of the epoxy bonded PCB assembly 204 and the base plate 202 composite structure, there is no structural need for a PCB shield plate, as the base plate 202 itself replaces its structural function. This integrated composite structure 200 can withstand tremendous shock and impact events without damage.

Figure 4:
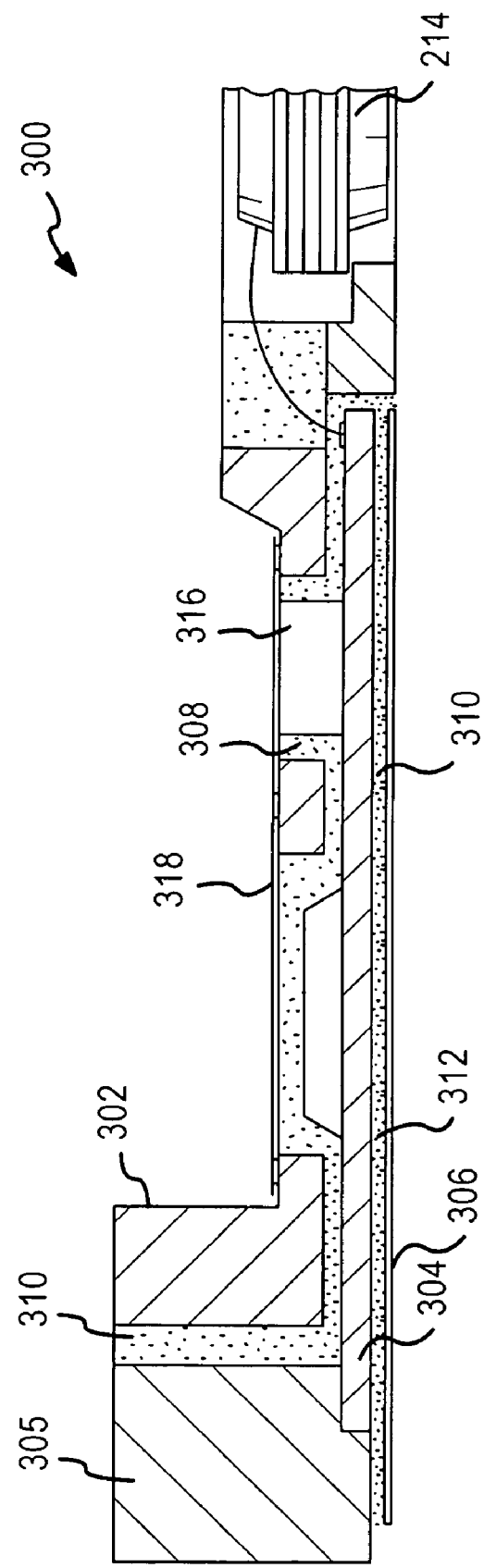
FIG. 4 is a partial cross sectional view of an alternative embodiment of an integrated base plate and printed circuit board structure for a disc drive constructed in accordance the present invention.
Figure 5:
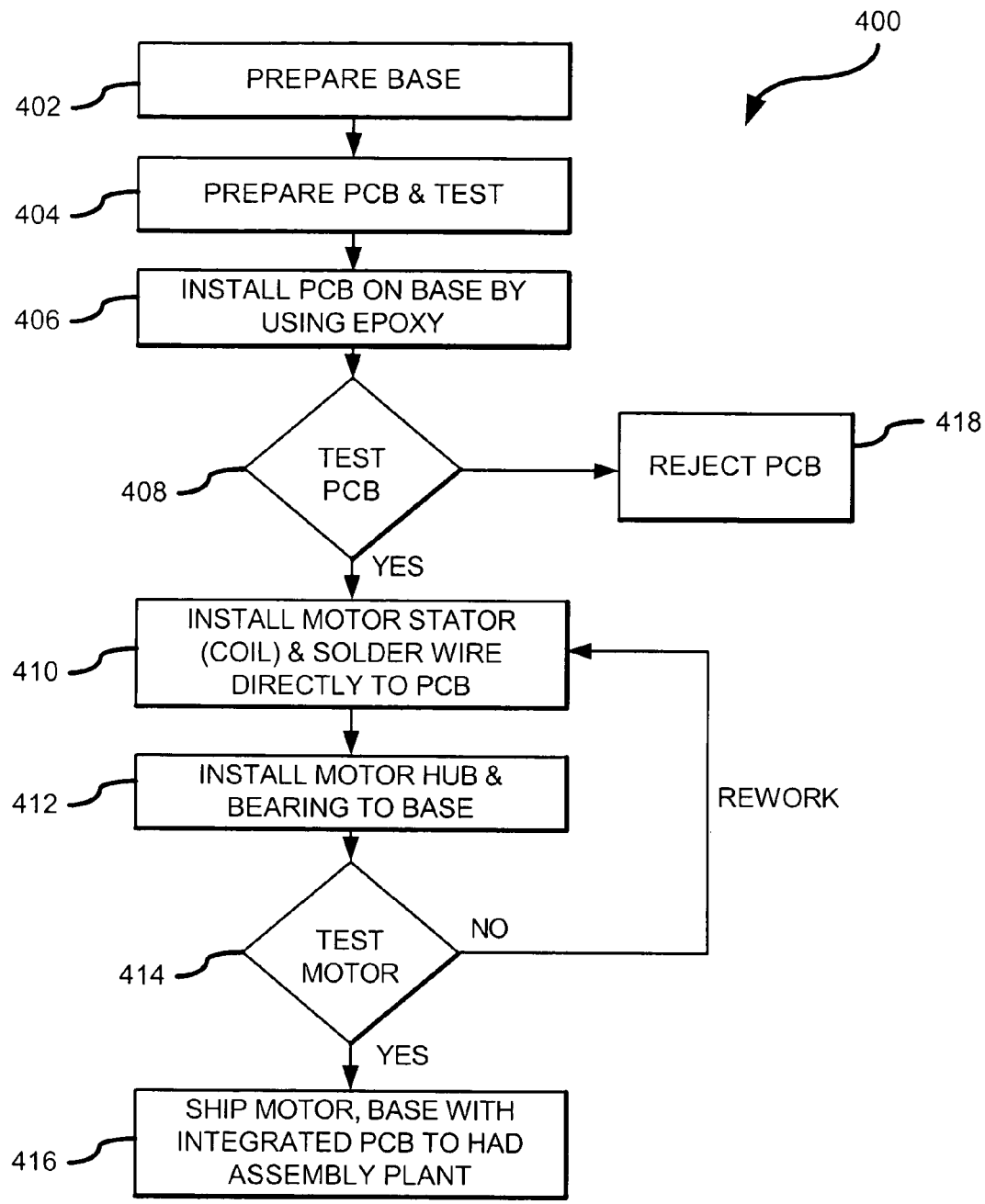
FIG. 5 is a process flow diagram for the manufacturing sequence of operations in constructing an integrated base plate and printed circuit board structure for a disc drive of the embodiment shown in FIG. 3.

Referring now to FIG. 4, an alternative embodiment 300 of the present invention is shown. The structure 300 includes a base plate 302 similar in configuration to the base plate 202 shown in FIG. 3 except that in this embodiment, a PCB shield 306 is installed beneath a printed circuit board assembly 304 that is epoxy bonded to the base plate 302. The assembly 304 includes a connector 305 that is also epoxy bonded to the base plate 302. Again, as in the first embodiment, at its thinnest, the base plate 302 itself is between about 0.2 mm and 0.3 mm in thickness. The assembly 304 is sandwiched to the base plate 302 and the gap 308 between these two components is filled with epoxy adhesive 310, which, when cured, bonds the base plate 302 to the PCB assembly 304. The PCB shield 306 is spaced from the PCB assembly 304 by a gap 312 which is filled with epoxy adhesive 310 bonding the shield 306 to the PCB assembly 304. Thus the three components, the base plate 302, the PCB assembly 304, and the PCB shield 306 together form the integrated, stiff, composite disc drive base structure 300. This results in a structure 300 that is substantially rigid, providing the necessary support structure for the disc spin motor 214 and actuator assembly (not shown), while facilitating an overall drive thickness of no more than 3.3 mm, thus again meeting the requirements for a Compact Flash card Type I form factor. The epoxy adhesive is preferably a thermally conductive epoxy to ensure that sufficient heat dissipation for the integrated circuit 316 on the PCB assembly 304 is maintained.

In either of the embodiments 200 or 300 described above, note that there are openings in the base plate 202 or 302 that permit the IC component 222 and 316 respectively to protrude through. An optional tape seal 318 may be installed over these openings as is shown in FIG. 4. This seal may be utilized to preclude off-gassing from the epoxy into the sealed environment inside the assembled disc drive should this present a potential problem. In the integrated structure 300, the additional layer of epoxy provides even further stiffness to the composite structure 300 compared to structure 200.

An operational flow diagram of the manufacturing process 400 for manufacturing the integrated composite base plate structure 200 or 300 in accordance with the present invention is shown. This process 400 may be performed manually, semi-manually or automated. Process 400 begins in operation 402 in which the base plate 202 or 302 is fabricated and prepared, i.e. formed, de-burred and cleaned. Then, or concurrently, in operation 404, the PCB and connector assembly 204 or 304 is assembled together into a single unit. Control then transfers to operation 406.

In operation 406, the PCB assembly 204 or 304 is installed on the base 202 or 302 respectively using epoxy adhesive. Control then transfers to query operation 408. In query operation 408, the assembled PCB/base plate is electrically tested. If the test is satisfactory, control transfers to operation 410. If not, the assembled base plate and PCB assembly is discarded in operation 418.

In operation 410, the drive motor stator coils are installed and leads directly soldered to the PCB and connector assembly. Control then transfers to operation 412 where the drive motor hub and bearing are assembled to the base plate 202 or 302. Control then passes to query operation 414.

In query operation 414, the drive motor is functionally tested to ensure that the connections were properly made and that the control circuits on the PCB and connector assembly function properly. If the unit tests ok, i.e., query operation 414 answer is yes, control transfers to operation 416. Otherwise, control transfers back to operation 410 for rework of the motor connections.

In operation 416, the assembled composite integrated base plate and PCB structure 200 or 300 is packaged and transferred to a disc drive assembly facility. Optionally, the full assembly of the disc drive may take place at the same facility.

It will be clear that the present invention is well adapted to attain the ends and advantages mentioned as well as those inherent therein. While a presently preferred embodiment has been described for purposes of this disclosure, various changes and modifications may be made which are well within the scope of the present invention. Numerous other changes may be made which will readily suggest themselves to those skilled in the art and which are encompassed in the spirit of the invention disclosed and as defined in the appended claims.

What is claimed is:

1. A composite structure comprising:
   a base having a first side and a second side, the first side having a patterned surface structure including at least one aperture extending through the base between the first side and the second side;
   a printed circuit board including at least one raised circuit component elevated from a board portion of the printed circuit board and the at least one raised circuit component extending into the at least one aperture and forming a space between an edge surface of the at least one aperture and the at least one raised circuit component;
   an adhesive portion in the at least one aperture that extends between the first and second sides of the base and between the edge surface of the at least one aperture and the at least one raised circuit component to fill the space between the at least one raised circuit component and the edge surface of the at least one aperture of the base; and
   an adhesive layer between the base and the board portion of the printed circuit board bonding the base to the printed circuit board.

2. The structure according to claim 1, wherein the adhesive layer between the base and the board portion forms a first adhesive layer and comprising a second adhesive layer between the printed circuit board and a shield to connect the shield to the printed circuit board.

3. The structure according to claim 1 wherein an overall thickness of the structure is less than 3.3 mm.

4. The structure according to claim 3 wherein the base has a portion having a thickness of between 0.2 mm and 0.3 mm.

5. The structure according to claim 1 wherein the adhesive portion is an epoxy adhesive.

6. The structure of claim 1 wherein the base includes a base portion having a base thickness of about 0.3 mm or less.

7. The structure of claim 1 and comprising at least one lead extending through the adhesive layer and soldered to a solder pad on the printed circuit board.

8. The structure of claim 1 wherein the adhesive portion and the adhesive layer are a thermally conductive epoxy.

9. The structure of claim 1 and comprising a tape seal on the at least one aperture.

10. A structure comprising:
   a base having a first side and a second side, the first side having a patterned surface structure including at least one aperture extending through the base between the first side and the second side;
   a printed circuit board including at least one raised circuit component elevated from a board portion of the printed circuit board and the at least one raised circuit component extending into the at least one aperture and forming a space between an edge surface of the at least one aperture and the at least one raised circuit component, wherein the printed circuit board has an upright connector;
   an adhesive portion in the at least one aperture that extends between the first and second sides of the base and between the edge surface of the at least one aperture and the at least one raised circuit component to fill the space between the at least one raised circuit component and the edge surface of the at least one aperture of the base; and
   an adhesive portion between the upright connector and an edge surface of the base.

11. The structure according to claim 10 wherein at least one of the adhesive portions is an epoxy adhesive.

12. The structure of claim 10 wherein the base includes a base portion having a base thickness of about 0.3 mm or less.

13. The structure of claim 10 and comprising an adhesive layer between the base and the board portion of the printed circuit board bonding the base to the printed circuit board.

14. The structure of claim 10 wherein each adhesive portion is a thermally conductive epoxy.

15. A composite structure for a data storage device comprising:
   a base having a first side and a second side;
   a printed circuit board spaced from the base to form a gap between the printed circuit board and the base;
   a shield spaced from the printed circuit board to form a gap between the printed circuit board and the shield; and
   a first adhesive portion filling the gap between the printed circuit board and the base to connect the printed circuit board to the base, and
   a second adhesive portion filling the gap between the printed circuit board and the shield to connect the shield to the printed circuit board.

16. The structure according to claim 15 wherein the base includes at least one aperture and the printed circuit board includes at least one circuit component extending into the at least one aperture and comprising an adhesive portion in the at least one aperture between an edge surface of the at least one aperture and the at least one circuit component.

17. The composite structure of claim 16 wherein the at least one aperture extends through the base between the first side and the second side of the base.

18. The structure according to claim 15 wherein an overall thickness of the structure is less than 3.3 mm.

19. The structure according to claim 18 wherein the base has a portion having a thickness of between 0.2 mm and 0.3 mm.

20. The composite structure of claim 15 wherein the printed circuit board includes at least one connector and comprising a third adhesive portion between an upright surface of the base and the at least one connector.

* * * * *